United States Patent
Lin et al.

(10) Patent No.: US 11,764,062 B2
(45) Date of Patent: Sep. 19, 2023

(54) METHOD OF FORMING SEMICONDUCTOR STRUCTURE

(71) Applicant: Taiwan Semiconductor Manufacturing Co., Ltd., Hsinchu (TW)

(72) Inventors: Ping-Hao Lin, Tainan (TW); Fu-Cheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

(21) Appl. No.: 16/175,819

(22) Filed: Oct. 30, 2018

(65) Prior Publication Data

US 2019/0148146 A1    May 16, 2019

Related U.S. Application Data

(60) Provisional application No. 62/584,916, filed on Nov. 13, 2017.

(51) Int. Cl.
| | | |
|---|---|---|
| *H01L 21/033* | (2006.01) | |
| *H01L 21/027* | (2006.01) | |
| *H01L 21/311* | (2006.01) | |
| *G03F 7/20* | (2006.01) | |
| *G03F 1/50* | (2012.01) | |

(Continued)

(52) U.S. Cl.
CPC ............ *H01L 21/0337* (2013.01); *G03F 1/50* (2013.01); *G03F 1/58* (2013.01); *G03F 7/094* (2013.01); *G03F 7/095* (2013.01); *G03F 7/70058* (2013.01); *G03F 7/70466* (2013.01); *H01L 21/0274* (2013.01); *H01L 21/0332* (2013.01); *H01L 21/31144* (2013.01);

(Continued)

(58) Field of Classification Search
CPC ........... H01L 21/0274; H01L 21/76811; H01L 27/1288; H01L 2221/1021; H01L 21/0273; G03F 7/094; G03F 7/70466; G03F 7/7095; G03F 7/095; G03F 7/70458; G03F 7/70083
See application file for complete search history.

(56) References Cited

U.S. PATENT DOCUMENTS

| | | | | |
|---|---|---|---|---|
| 4,315,984 A | * | 2/1982 | Okazaki | .............. H01L 21/7688 438/670 |
| 4,645,562 A | * | 2/1987 | Liao | .................. H01L 21/31144 438/640 |

(Continued)

FOREIGN PATENT DOCUMENTS

| | | |
|---|---|---|
| TW | 200944936 | 11/2009 |
| TW | 201629619 | 8/2016 |
| WO | 2008116477 | 10/2008 |

OTHER PUBLICATIONS

"Office Action of Taiwan Counterpart Application," dated Oct. 24, 2019, p. 1-p. 5.

(Continued)

*Primary Examiner* — Sophia T Nguyen
(74) *Attorney, Agent, or Firm* — JCIPRNET

(57) ABSTRACT

A method of forming a semiconductor structure is disclosed. A multi-layer structure is formed over a substrate. A photoresist stack with a stepped sidewall is formed on the multi-layer structure. A pattern of the photoresist stack is transferred to the multi-layer structure.

20 Claims, 12 Drawing Sheets

(51) Int. Cl.
  *G03F 1/58*       (2012.01)
  *G03F 7/09*       (2006.01)
  *G03F 7/095*      (2006.01)
  *H01L 21/768*     (2006.01)
  *G03F 7/00*       (2006.01)

(52) U.S. Cl.
  CPC .. *H01L 21/76811* (2013.01); *H01L 21/76807* (2013.01); *H01L 2221/1021* (2013.01)

(56) References Cited

U.S. PATENT DOCUMENTS

| | | | | |
|---|---|---|---|---|
| 4,670,090 A * | 6/1987 | Sheng | G03F 7/095 | 257/194 |
| 4,770,739 A * | 9/1988 | Orvek | G03F 7/095 | 430/318 |
| 4,859,573 A * | 8/1989 | Maheras | G03F 7/0035 | 430/326 |
| 4,865,952 A * | 9/1989 | Yoshioka | G03F 1/22 | 430/315 |
| 4,891,303 A * | 1/1990 | Garza | H01L 21/31138 | 216/48 |
| 4,985,374 A * | 1/1991 | Tsuji | G03F 7/2022 | 438/723 |
| 5,244,759 A * | 9/1993 | Pierrat | G03F 1/29 | 430/296 |
| 5,275,896 A * | 1/1994 | Garofalo | G03F 1/29 | 430/296 |
| 5,288,660 A * | 2/1994 | Hua | H01L 21/76802 | 257/E21.027 |
| 5,407,785 A * | 4/1995 | Leroux | G03F 1/28 | 430/312 |
| 5,455,145 A * | 10/1995 | Tarumoto | G03F 7/095 | 430/273.1 |
| 5,583,063 A * | 12/1996 | Samoto | H01L 21/28587 | 438/570 |
| 5,635,337 A * | 6/1997 | Bartha | G03F 7/00 | 216/18 |
| 5,693,548 A * | 12/1997 | Lee | G03F 7/2059 | 438/172 |
| 5,741,624 A * | 4/1998 | Jeng | G03F 1/26 | 257/E21.027 |
| 5,753,417 A * | 5/1998 | Ulrich | G03F 7/2022 | 430/312 |
| 5,877,075 A * | 3/1999 | Dai | H01L 21/0274 | 257/E21.027 |
| 5,877,076 A * | 3/1999 | Dai | H01L 21/0274 | 257/E21.027 |
| 5,882,996 A * | 3/1999 | Dai | H01L 21/31144 | 257/E21.257 |
| 5,906,910 A * | 5/1999 | Nguyen | G03F 1/29 | 430/311 |
| 5,935,762 A * | 8/1999 | Dai | G03F 7/265 | 257/E21.579 |
| 5,936,707 A * | 8/1999 | Nguyen | G03F 1/50 | 355/18 |
| 6,042,975 A * | 3/2000 | Burm | G03F 9/708 | 257/E21.027 |
| 6,140,226 A * | 10/2000 | Grill | H01L 21/76811 | 257/E21.579 |
| 6,200,906 B1 * | 3/2001 | Batra | H01L 21/0274 | 257/E21.027 |
| 6,242,344 B1 * | 6/2001 | Koh | H01L 21/0276 | 257/E21.029 |
| 6,261,960 B1 * | 7/2001 | Yu | H01L 21/76802 | 216/38 |
| 6,270,948 B1 * | 8/2001 | Sato | G03F 7/094 | 430/314 |
| 6,350,674 B1 * | 2/2002 | Okamura | H01L 21/0274 | 257/E21.027 |
| 6,372,660 B1 * | 4/2002 | Jeng | H01L 21/76801 | 257/E21.576 |
| 6,391,499 B1 * | 5/2002 | Kim | G03F 1/54 | 430/5 |
| 6,403,456 B1 * | 6/2002 | Plat | H01L 21/28114 | 257/E21.205 |
| 6,436,810 B1 * | 8/2002 | Kumar | H01L 21/0277 | 257/E21.03 |
| 6,465,157 B1 * | 10/2002 | Li | H01L 21/76811 | 257/E21.579 |
| 6,468,898 B1 * | 10/2002 | Usami | H01L 21/76811 | 257/E21.579 |
| 6,514,857 B1 * | 2/2003 | Naik | H01L 21/3121 | 438/638 |
| 6,605,536 B2 * | 8/2003 | Eissa | H01L 21/31116 | 257/E21.252 |
| 6,737,222 B2 * | 5/2004 | Subramanian | H01L 21/76808 | 430/312 |
| 6,787,455 B2 * | 9/2004 | Tsai | G03F 7/094 | 257/E21.027 |
| 6,943,124 B1 * | 9/2005 | Lu | G03F 7/11 | 438/725 |
| 6,962,771 B1 * | 11/2005 | Liu | G03F 7/095 | 430/311 |
| 7,078,348 B1 * | 7/2006 | Singh | H01L 21/31144 | 216/47 |
| 7,229,723 B2 * | 6/2007 | Rau | G03F 7/0035 | 430/394 |
| 7,229,745 B2 * | 6/2007 | Lamarre | G03F 7/0035 | 430/313 |
| 7,288,366 B2 * | 10/2007 | Tan | G03F 1/32 | 430/311 |
| 7,352,064 B2 * | 4/2008 | Fuller | H01L 21/0332 | 257/750 |
| 7,501,348 B2 * | 3/2009 | Chen | H01L 21/0272 | 257/E21.218 |
| 7,579,137 B2 * | 8/2009 | Colburn | G03F 7/094 | 430/313 |
| 7,704,875 B1 * | 4/2010 | Wu | H01L 21/76816 | 438/637 |
| 7,969,554 B2 * | 6/2011 | Melville | G03F 7/70125 | 355/67 |
| 7,989,341 B2 * | 8/2011 | Tseng | G03F 1/54 | 257/E21.579 |
| 8,071,278 B1 * | 12/2011 | Yamamoto | G03F 1/50 | 430/311 |
| 8,492,079 B2 * | 7/2013 | Chen | G03F 7/095 | 430/394 |
| 8,536,031 B2 * | 9/2013 | Arnold | G03F 7/38 | 438/513 |
| 8,791,024 B1 * | 7/2014 | Lu | H01L 21/0274 | 438/708 |
| 9,081,312 B2 * | 7/2015 | Lu | H01L 21/0274 | |
| 9,306,041 B2 * | 4/2016 | Hwang | H01L 29/66833 | |
| 9,966,386 B2 * | 5/2018 | Kato | H10B 41/10 | |
| 10,488,699 B2 * | 11/2019 | Yu | G02F 1/13394 | |
| 2001/0053486 A1 | 12/2001 | Matsunuma | | |
| 2002/0018964 A1 * | 2/2002 | Jerominek | B81C 1/00396 | 430/313 |
| 2002/0061470 A1 * | 5/2002 | Subramanian | G03F 7/095 | 430/314 |
| 2003/0064581 A1 * | 4/2003 | Pan | H01L 21/76811 | 438/637 |
| 2003/0073013 A1 * | 4/2003 | Hsu | G03F 7/70591 | 430/30 |
| 2003/0123039 A1 * | 7/2003 | Yen | G03F 7/70141 | 355/68 |
| 2003/0186141 A1 * | 10/2003 | Park | G03F 7/70433 | 430/22 |
| 2003/0207207 A1 * | 11/2003 | Li | H01L 21/0331 | 430/272.1 |
| 2004/0087166 A1 * | 5/2004 | Morrow | H01L 21/0332 | 438/694 |
| 2004/0197676 A1 * | 10/2004 | Rau | H01L 21/0274 | 430/394 |
| 2005/0020050 A1 * | 1/2005 | Huang | H01L 24/11 | 438/613 |

(56) References Cited

U.S. PATENT DOCUMENTS

| | | | |
|---|---|---|---|
| 2005/0089763 A1* | 4/2005 | Tan | G03F 1/32 430/312 |
| 2005/0196708 A1* | 9/2005 | Hsu | G03F 7/0005 430/321 |
| 2006/0014381 A1* | 1/2006 | Lee | H01L 21/76807 438/638 |
| 2007/0003841 A1* | 1/2007 | Choi | G03F 1/50 430/5 |
| 2007/0054198 A1* | 3/2007 | Park | G03F 1/50 430/5 |
| 2007/0134911 A1* | 6/2007 | Kang | H01L 21/31144 438/624 |
| 2007/0148598 A1* | 6/2007 | Colburn | G03F 1/50 430/394 |
| 2007/0166648 A1* | 7/2007 | Ponoth | H01L 21/76811 430/311 |
| 2007/0178409 A1* | 8/2007 | Chiang-Lin | G03F 7/2022 430/311 |
| 2007/0178410 A1* | 8/2007 | Shih | H01L 21/0274 430/311 |
| 2008/0102382 A1* | 5/2008 | Waiblinger | G03F 1/76 430/323 |
| 2008/0111204 A1* | 5/2008 | Yun | H01L 27/14685 257/E31.127 |
| 2009/0023078 A1* | 1/2009 | Gutmann | G03F 1/29 430/5 |
| 2009/0117491 A1* | 5/2009 | Hendel | G03F 7/203 430/296 |
| 2009/0142926 A1* | 6/2009 | Dai | H01L 21/0338 438/703 |
| 2009/0179234 A1* | 7/2009 | Maher | H01L 29/42316 257/256 |
| 2010/0015748 A1* | 1/2010 | Yun | H01L 27/14685 257/E31.127 |
| 2010/0078823 A1* | 4/2010 | Beyer | H01L 21/76816 257/773 |
| 2010/0097859 A1* | 4/2010 | Shim | G11C 16/0483 365/185.05 |
| 2010/0272967 A1* | 10/2010 | Chen | G03F 7/095 428/195.1 |
| 2010/0304568 A1* | 12/2010 | Miyoshi | H01L 21/0274 430/311 |
| 2011/0049646 A1* | 3/2011 | Lim | H01L 29/7926 257/E21.409 |
| 2011/0065270 A1* | 3/2011 | Shim | H01L 29/7926 257/E21.613 |
| 2011/0091797 A1* | 4/2011 | Chang | G03F 7/70283 430/5 |
| 2011/0111348 A1* | 5/2011 | Schultz | H01L 21/76816 430/312 |
| 2011/0199804 A1* | 8/2011 | Son | H01L 27/11582 365/51 |
| 2011/0204523 A1* | 8/2011 | Arnold | G03F 7/38 257/773 |
| 2011/0311914 A1* | 12/2011 | Kamimura | G03F 7/32 430/270.1 |
| 2012/0132983 A1* | 5/2012 | Fukuzumi | H10B 43/50 257/E21.423 |
| 2012/0147650 A1* | 6/2012 | Samachisa | G11C 13/0002 257/E21.645 |
| 2012/0156450 A1* | 6/2012 | Huang | G03F 7/70466 428/195.1 |
| 2013/0026639 A1* | 1/2013 | Arnold | H01L 21/0274 257/773 |
| 2013/0065383 A1* | 3/2013 | Qiu | H01L 21/0272 438/584 |
| 2013/0178068 A1* | 7/2013 | Yen | H01L 21/0274 438/700 |
| 2013/0234302 A1* | 9/2013 | Hu | H01L 21/0274 430/312 |
| 2013/0271705 A1* | 10/2013 | Chen | G02F 1/133516 427/163.1 |
| 2014/0015057 A1* | 1/2014 | Lee | H01L 21/0332 257/E21.409 |
| 2014/0048868 A1* | 2/2014 | Kim | H01L 29/7926 257/324 |
| 2014/0109785 A1* | 4/2014 | Pauliac | G03F 7/0035 101/450.1 |
| 2014/0159127 A1* | 6/2014 | Lee | H10B 41/50 257/288 |
| 2014/0192301 A1* | 7/2014 | Wu | G02F 1/133516 349/106 |
| 2014/0197481 A1 | 7/2014 | Hwang et al. | |
| 2014/0342272 A1* | 11/2014 | Lu | G03F 7/20 430/296 |
| 2014/0342564 A1 | 11/2014 | Lu et al. | |
| 2015/0132963 A1* | 5/2015 | Kuo | H01L 21/32139 438/703 |
| 2015/0137216 A1* | 5/2015 | Lee | H01L 29/66833 257/329 |
| 2015/0200130 A1* | 7/2015 | Huang | H01L 21/0274 438/618 |
| 2015/0228623 A1* | 8/2015 | Oh | H10B 41/27 257/315 |
| 2015/0318173 A1* | 11/2015 | Shih | H01L 21/31144 438/702 |
| 2015/0372101 A1* | 12/2015 | Lee | H01L 27/11575 257/314 |
| 2016/0071735 A1* | 3/2016 | Yen | H01L 21/0337 438/478 |
| 2016/0163686 A1* | 6/2016 | Lee | H01L 27/11524 257/314 |
| 2016/0268278 A1* | 9/2016 | Kono | H10B 43/35 |
| 2016/0300732 A1* | 10/2016 | Hosomomi | H01L 23/49894 |
| 2016/0343746 A1* | 11/2016 | Xue | H01L 29/6675 |
| 2017/0011996 A1* | 1/2017 | Lee | H01L 27/1157 |
| 2017/0052445 A1* | 2/2017 | Weng | G03F 7/0035 |
| 2017/0110366 A1* | 4/2017 | Lu | G03F 1/20 |
| 2017/0207221 A1* | 7/2017 | Kim | H01L 27/1052 |
| 2017/0256551 A1* | 9/2017 | Lee | H01L 27/1157 |
| 2018/0031910 A1* | 2/2018 | Li | G02F 1/13394 |
| 2018/0182775 A1* | 6/2018 | Kim | H01L 27/1157 |
| 2019/0072801 A1* | 3/2019 | Cao | G02F 1/13394 |
| 2019/0148146 A1* | 5/2019 | Lin | G03F 7/70466 438/703 |
| 2019/0204664 A1* | 7/2019 | Yu | G02F 1/133512 |

OTHER PUBLICATIONS

"Office Action of Taiwan Counterpart Application," dated May 22, 2019, p. 1-p. 4.

"Office Action of China Counterpart Application", dated Sep. 28, 2022, p. 1-p. 14.

"Office Action of China Counterpart Application", dated Feb. 26, 2023, p. 1-p. 15.

* cited by examiner

METHOD OF FORMING SEMICONDUCTOR STRUCTURE

CROSS-REFERENCE TO RELATED APPLICATION

This application claims the priority benefits of U.S. provisional application Ser. No. 62/584,916, filed on Nov. 13, 2017. The entirety of the above-mentioned patent application is hereby incorporated by reference herein and made a part of this specification.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs are commonly formed by a sequence of material layers, some of which are patterned by photolithography processes. Photolithography processes are a significant contributor to the overall cost of manufacturing, including processing time and the cost of photomasks used in the process. Therefore, a cost-effective lithography method is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
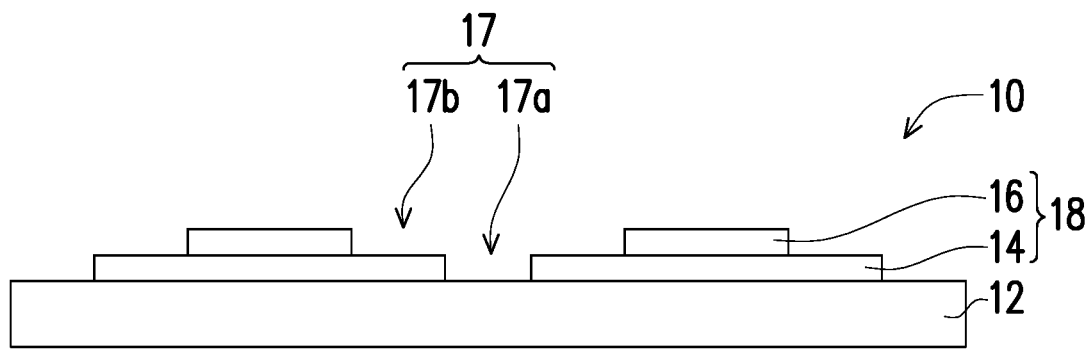
FIG. 1 is a cross-sectional view of a photomask in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a photomask in accordance with some embodiments. In some embodiments, a photomask (also referred to as reticle) is used to pattern two photoresist layers by a two-exposure-two-development process. Specifically, two exposure (or exposing) processes and two development (or developing) processes are performed alternately to the two photoresist layers with a single photomask, and the finished photoresist stack is a composite of the photoresist patterns from the two-exposure-two-development process.

In some embodiments, a photomask 10 includes a mask substrate 12, a first mask pattern 14 and a second mask pattern 16. The mask substrate 12 has a reference transmittance T0 to the exposure radiation (such as ultraviolet-UV beam, or deep UV-DUV beam) during a photolithography exposure process using the mask 10. In some embodiments, the mask substrate 12 is a transparent substrate, such as a fused quartz substrate. In some embodiments, the reference transmittance T0 is assigned to be 100% and other transmittances are defined relative to the reference transmittance T0.

The first mask pattern 14 is disposed over the mask substrate 12. The first mask pattern 14 has a first transmittance T1 to the exposure radiation. The first transmittance T1 is less than the reference transmittance T0. In some embodiments, the first transmittance T1 ranges between about 15% and about 90%, such as between about 20% and about 80%. The first mask pattern 14 partially attenuates the exposure radiation. The transmittance of the first mask pattern 14 is determined by its composition and thickness. In some embodiments, the first mask pattern 14 includes molybdenum silicon (MoSi). Furthermore, the first mask pattern 14 is deposited with the ratio of Mo and Si tuned for desired refractive index (n) and the extinction coefficient (k) according to the wavelength of the exposure radiation. The first mask pattern 14 is designed to have a suitable thickness for expected transmittance. In one example, the first mask pattern 14 has a thickness ranging between about 5 nm and about 40 nm. Alternatively, the first mask pattern 14 includes other attenuating material, such as zirconium silicon oxide (ZrSiO), silicon nitride (SiN), and/or titanium nitride (TiN).

The second mask pattern 16 is disposed over the first mask pattern 12. The second mask pattern 16 has a second transmittance T2 to the exposure radiation. In some embodiments, the second transmittance T2 is different from (e.g., less than) the first transmittance T1. In some embodiments, the second mask pattern 16 substantially attenuates the exposure radiation and the second transmittance T2 is less than about 10%, such as between about 5% and about 10% or between about 0% and about 6%. In some embodiments, the second mask pattern 16 includes chromium (Cr). In one example, the second mask pattern 16 of Cr has a thickness ranging between about 5 nm and about 80 nm. Alternatively, the second mask pattern 16 may include other attenuating material.

The first and second transmittances T1 and T2 are defined relative to the reference transmittance T0. In some embodiments, the second transmittance T2 is less than 10% of the reference transmittance T0 and the first transmittance T1 ranges between about 15% and about 90% of the reference transmittance T0. Other transmittance ranges are possible and may be desirable in certain applications.

In some embodiments, the width of the second mask pattern 16 is smaller than the width of the first mask pattern 14. In some embodiments, the boundary of the second mask pattern 16 is within the boundary of the first mask pattern 14, and the first mask pattern 14 and the second mask pattern 16 constitute a mask stack 18 having stepped sidewalls at both sides. However, the present disclosure is not limited thereto. In alternative embodiments, the second mask pattern 16 and the first mask pattern 14 are aligned at one side, while constitute a stepped sidewall at the opposite side.

In some embodiments, two mask stacks 18 are arranged side by side on the mask substrate 12, and an opening pattern 17 having a stepped sidewall is formed between the mask stacks 18.

In some embodiments, each opening pattern 17 includes an opening 17a between adjacent first mask patterns 12 of the mask stacks 18 and an opening 17b between adjacent second mask patterns 14 of the mask stacks 18. In some embodiments, each of the openings 17a and 17b has a substantially vertical sidewall. In alternative embodiments, at least one of openings 17a and 17b has an inclined sidewall.

Various openings in the mask 10 define various features in the IC pattern. In some embodiments, the opening 17a defines a first feature (e.g., via pattern) in a first layer of an integrated circuit, and the opening 17b defines a second feature (e.g., metal line pattern) in a second layer of the integrated circuit. In some embodiments, the via pattern and the metal line pattern are collectively a portion of an interconnect structure, a damascene structure or a redistribution layer structure in the integrated circuit.

FIG. 2A to FIG. 2G are schematic cross-sectional views of a method of forming a semiconductor structure in accordance with some embodiments. In some embodiments, the method to pattern two photoresist layers by using the mask 10 and the semiconductor structure made thereby are further described below according to one embodiment with reference to FIG. 2A to FIG. 2G.

Figure 2A:
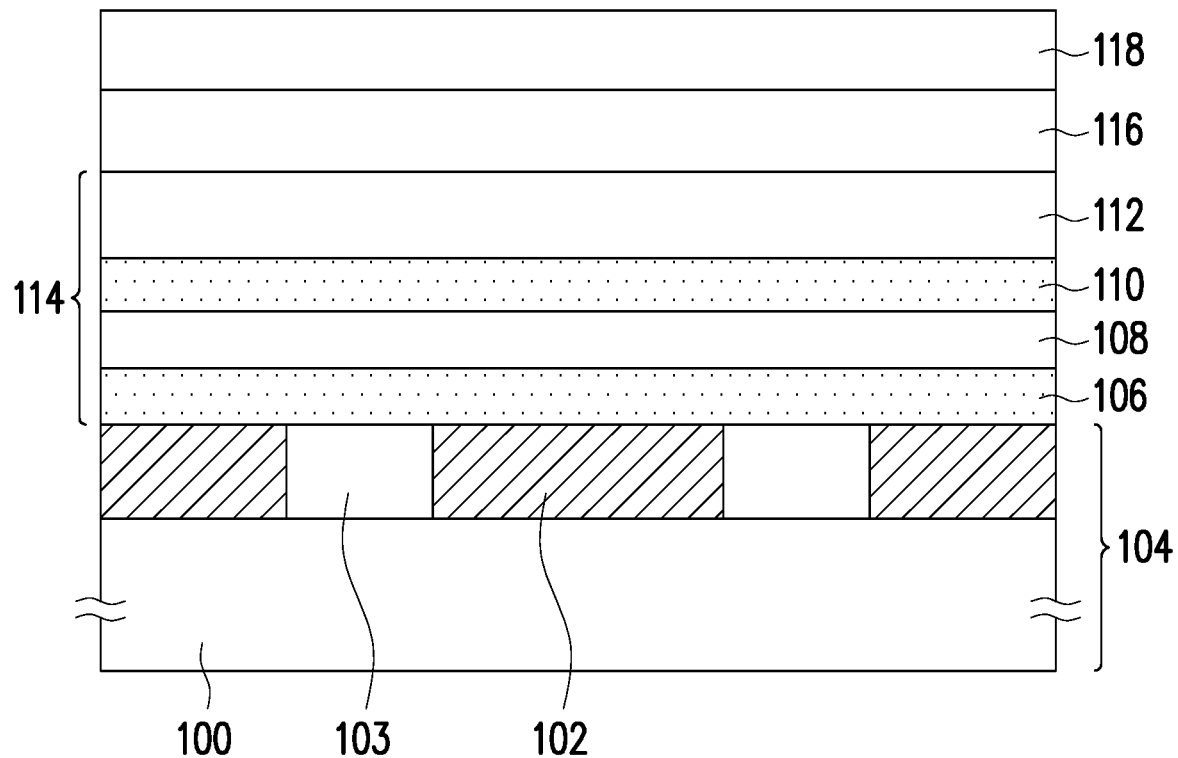
FIG. 2A to FIG. 2G are schematic cross-sectional views of a method of forming a semiconductor structure in accordance with some embodiments.

Referring to FIG. 2A, a substrate 104 is provided with a multi-layer structure 114, a first photoresist layer 116 and a second photoresist layer 118 sequentially formed thereon. In some embodiments, the substrate 104 includes a semiconductor base 100 such as a silicon base. Alternatively, the semiconductor base 100 includes germanium, silicon germanium or a suitable semiconductor material, such as diamond, silicon carbide or gallium arsenic. The substrate 104 may include various p-type doped regions and/or n-type doped regions configured and coupled to form various devices and functional features. The substrate 104 may include other features, such as shallow trench isolation (STI) features. The substrate 104 may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

In some embodiments, the substrate 104 includes metal features 102 embedded in an insulating layer 103, as shown in FIG. 1A. In some embodiments, the metal features 102 are metal lines of a metal layer of an interconnect structure, and the insulating layer 103 is a dielectric layer. In alternative embodiments, the substrate 104 may include one or more semiconductor chips, the metal features 102 are contacts of the semiconductor chips, and the insulating layer 103 is a polymer layer.

In some embodiments, the multi-layer structure 114 includes a first insulating layer 108 and a second insulating layer 112 over the first insulating layer 108. In some embodiments, the first insulating layer 108 and the second insulating layer 112 each include a non-organic dielectric material, such as silicon oxide, un-doped silicate glass (USG), a low-k dielectric material having a dielectric constant less than 3.5, a suitable dielectric material or a combination thereof. In alternative embodiments, the first insulating layer 108 and the second insulating layer 112 each include a polymer material, such as an epoxy, polyimide, benzocyclobutene (BCB), polybenzoxazole (PBO), or the like, although other relatively soft, often organic, dielectric materials can also be used.

In some embodiments, a first etch stop layer 106 and a second etch stop layer 110 are further included in the multi-layer structure 114. In some embodiments, the first etch stop layer 106 is formed between the substrate 104 and the first insulating layer 108, and the second etch stop layer 110 is formed between the first insulating layer 108 and the second insulating layer 112. The first etch stop layer 106 (or second etch stop layer 110) has an etch selectivity to the overlying first insulating layer 108 (or second insulating layer 112) and functions to stop etch during subsequent operation to pattern the insulating layer. The first etch stop layer 106 (or second etch stop layer 110) is different from the first insulating layer 108 (or second insulating layer 112) in composition and includes another dielectric material, such as silicon nitride, silicon oxynitride or silicon carbide. Various dielectric or polymer materials may be deposited by a suitable technique, such as chemical vapor deposition (CVD), spin-on coating or a suitable method.

Two photoresist layers are subsequently formed on the second insulating layer 112. Specifically, a first photoresist layer 116 is formed over the second insulating layer 112. The first photoresist layer 116 is formed by spin-on coating or a suitable technique. A second photoresist layer 118 is formed over the first photoresist layer 116. The second photoresist layer 118 is formed by spin-on coating or a suitable technique. Other processes, such as soft baking (SB), may follow the coating of each photoresist layer. In some embodiments, the first and second photoresist layers 116 and 118 have different compositions from each other. For example, the first and second photoresist layers 116 and 118 are both positive-tone photoresist layers with different photoresist materials sensitive to exposure radiation.

In some embodiments, the second photoresist layer 118 is formed directly on or in physical contact with the first photoresist layer 116. In some embodiments, a first developer is used to develop the first photoresist layer 116 and a second developer is used to develop the second photoresist layer 118. In some embodiments, the first developer is the same as the second developer, and the first and second photoresist layers 116 and 118 can be developed in the same developer unit. However, the present disclosure is not limited thereto. In alternative embodiments, the first developer is different from the second developer, and the first and second photoresist layers 116 and 118 can be developed in different developer units.

In some embodiments, the first and second photoresist layers 116 and 118 are chosen to have different exposure thresholds or threshold exposure doses.

Each photoresist material has its respective exposure threshold to radiation (for example an e-beam of an e-beam system). When the exposure dose (also referred to as exposure intensity in some embodiments, or exposure energy in alternative embodiments) is equal to or greater than the exposure threshold, the corresponding portion of the photoresist is chemically changed such that it will be developed (e.g., it is removed by the developer when the photoresist is positive-tone) in a development process. When the exposure dose is less than the exposure threshold, the corresponding portion of the photoresist is not chemically changed to be developed (e.g., it remains during the development process when the photoresist is positive tone). It is understood that the term "changed" means that the photoresist has sufficiently changed to respond differently, e.g., as exposed positive-tone photoresist responds in the development process. In one example where the photoresist is positive-tone, only portions of the photoresist exposed with exposure dose equal to or greater than the exposure threshold are removed by a suitable developer during the development process. Other portions of the photoresist unexposed or exposed with exposure dose less than the exposure threshold remain after the development process.

In some embodiments, the second photoresist layer 118 attenuates the exposure radiation during the exposure process such that the exposure radiation projected on the second photoresist layer 118 is partially absorbed and only a portion of the exposure radiation reaches the first photoresist layer 116. Thus, the exposure doses to the first and second photoresist layers are different. In some embodiments, the exposure thresholds of the first and second photoresist layers 116 and 118 are chosen to be different. For example, the second photoresist layer 118 has a relatively low exposure threshold and the first photoresist layer 116 has a relatively high exposure threshold. Specifically, the exposure threshold of the first photoresist layer 116 is higher than that of the second photoresist layer 118.

Figure 2B:
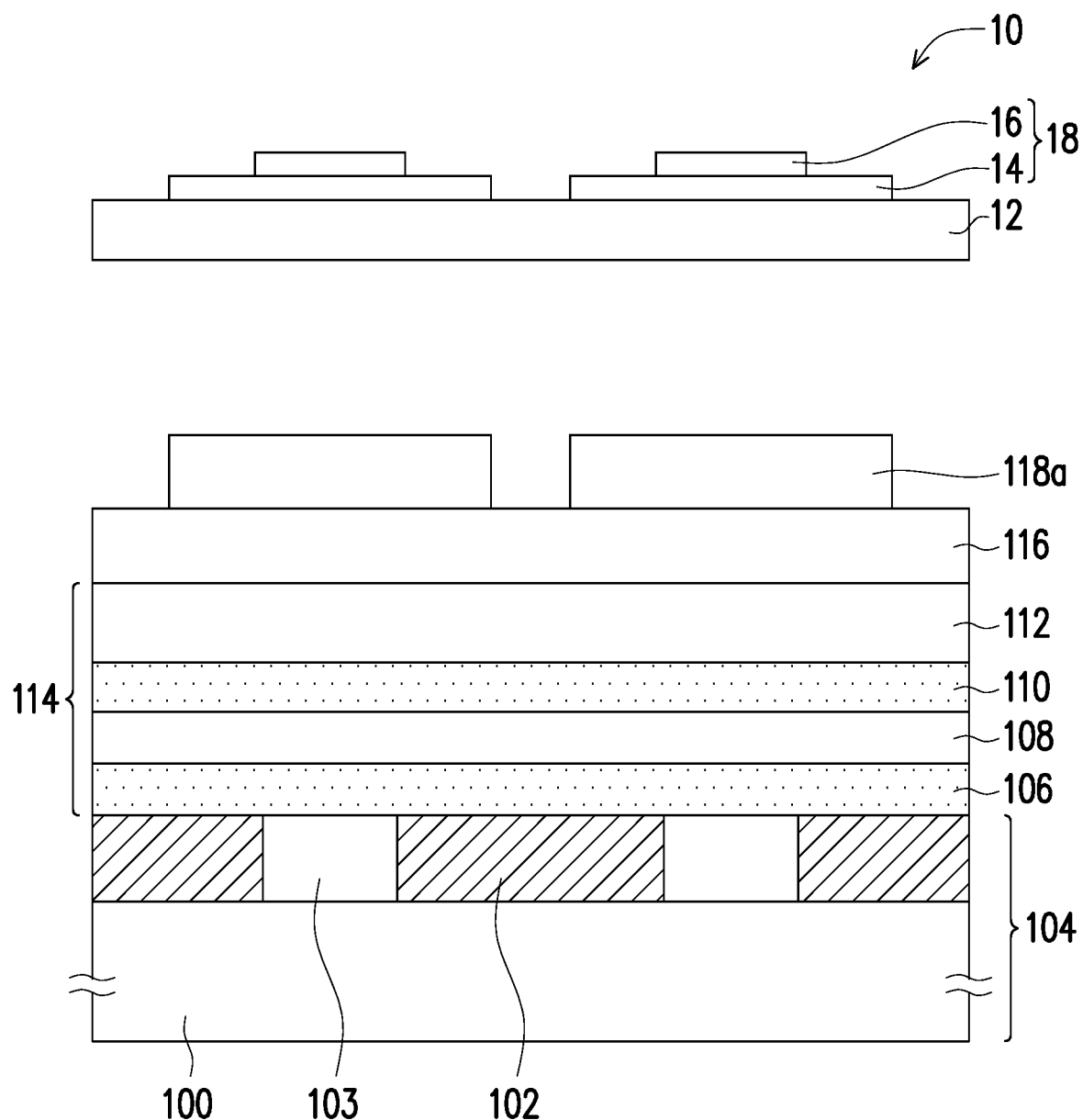

Referring to FIG. 2B, a first photolithography operation is performed by using the photomask 10, so as to transfer the pattern of the first mask pattern 14 to the second photoresist layer 118 to form a temporary photoresist pattern 118a.

Specifically, a first exposure process is implemented using the mask 10 to simultaneously expose both the first and second photoresist layers 116 and 118. Other processes, such as post-exposure-baking (PEB), may follow the first exposure process. In some embodiments, the exposure light of the first exposure process does not transmit through both the first and second mask patterns 14 and 16 of the photomask 10. In some embodiments, the first exposure dose of the first exposure process is greater than the exposure threshold of the second photoresist layer 118 but lower than the exposure threshold of the first photoresist layer 116. Therefore, the exposed portions of the second photoresist layer 118 are developed in a first development process, while the exposed portions of the first photoresist layer 116 remain after the first development process. In some embodiments, after developing the exposed first and second photoresist layers 116 and 118 with a first developer, the pattern of the first mask pattern 14 is transferred to the second photoresist layer 118 to form a temporary photoresist pattern 118a.

Herein, the figures are provided for illustration purposes and for easy explanation of the pattern transferring process, and should not be construed as limitation on scope of the present disclosure. It is appreciated by people having ordinary skilled in the art that the projected image of the photolithography apparatus (e.g., scanner) is, for example, four times smaller than the physical features in the photomask 10. Specifically, it is appreciated by people having ordinary skilled in the art that the dimension of the temporary photoresist pattern 118a is, for example, four times smaller than the dimension of the first mask pattern 14 of the photomask 10.

Figure 2C:
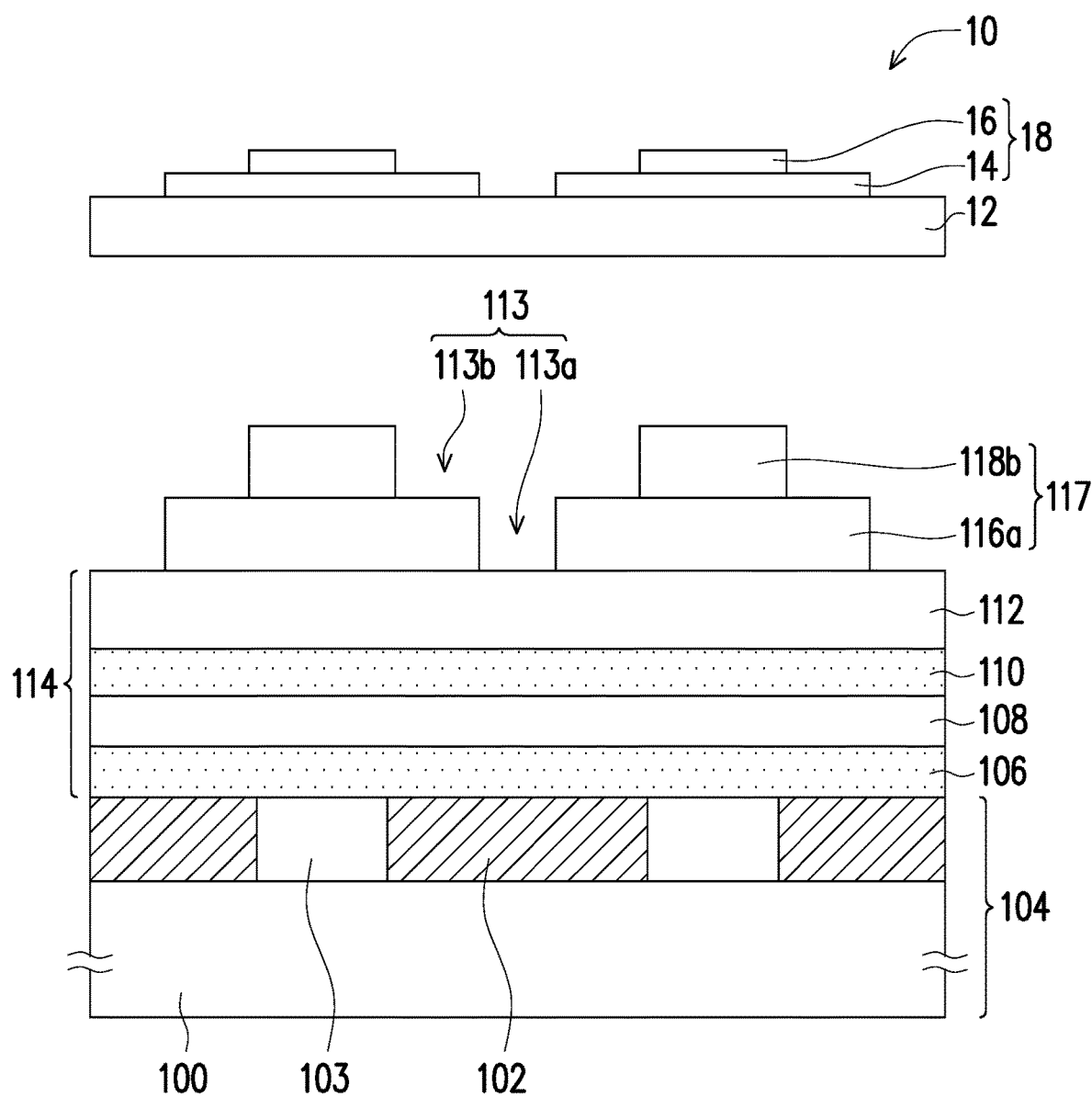

Referring to FIG. 2C, a second photolithography operation is performed by using the photomask 10, so as to transfer the pattern of the first mask pattern 14 to the first photoresist layer 116 to form a first photoresist pattern 116a, and transfer the pattern of the second mask pattern 16 to the temporary photoresist pattern 118a to form a second photoresist pattern 118b.

Specifically, a second exposure process is implemented using the same mask 10 to simultaneously expose both the first and second photoresist layers 116 and 118. Other processes, such as post-exposure-baking (PEB), may follow the second exposure process. In some embodiments, the exposure light of the second exposure process does not transmit through the second mask pattern 16 of the photomask 10 but partially transmits through the first mask pattern 14 of the photomask 10. In some embodiments, the second exposure dose of the second exposure process is greater than the exposure threshold of the first photoresist layer 116. However, part of the second exposure dose of the second exposure process is reduced by the first mask pattern 14 of the photomask 10, and the remaining second exposure dose is greater than the exposure threshold of the second photoresist layer 118 but lower than the exposure threshold of the first photoresist layer 116. In some embodiments, after developing the exposed first and second photoresist layers 116 and 118 with a second developer, the pattern of the first mask pattern 14 is transferred to the first photoresist layer 116 to form a first photoresist pattern 116a, and the pattern of the second mask pattern 16 is transferred to the temporary photoresist pattern 118a to form a second photoresist pattern 118b.

Herein, the figures are provided for the illustration purposes and for easy explanation of the pattern transferring process, and should not be construed as limitation on scope of the present disclosure. It is appreciated by people having ordinary skilled in the art that the projected image of the photolithography apparatus (e.g., scanner) is, for example, four times smaller than the physical features in the photomask 10. Specifically, it is appreciated by people having ordinary skilled in the art that the dimension of the first photoresist pattern 116a is, for example, four times smaller than the dimension of the first mask pattern 14 of the photomask 10, and the dimension of the second photoresist pattern 118b is, for example, four times smaller than the dimension of the second mask pattern 16 of the photomask 10.

In some embodiments, the width of the second photoresist pattern 118b is smaller than the width of the first photoresist pattern 116a. In some embodiments, the boundary of the second photoresist pattern 118b is within the boundary of the first photoresist pattern 116a. In some embodiments, a first photoresist pattern 116a and a second photoresist pattern 118b constitute a photoresist stack 117 with a stepped sidewall. In some embodiments, two photoresist stacks 117 are arranged side by side on the multi-layer structure 114, and an opening pattern 113 is formed between the photoresist stacks 117. In some embodiments, the opening patterns 113 are in physical contact with the underlying metal features 102. In some embodiments, each of the opening patterns 113 includes a first opening 113a that defines a first feature (e.g., via pattern) in a first layer of an integrated circuit, and a second opening 113b that defines a second feature (e.g., metal line pattern) in a second layer of the integrated circuit. In some embodiments, each of the opening patterns 113 defines a damascene structure or a redistribution layer structure.

Figure 2D:
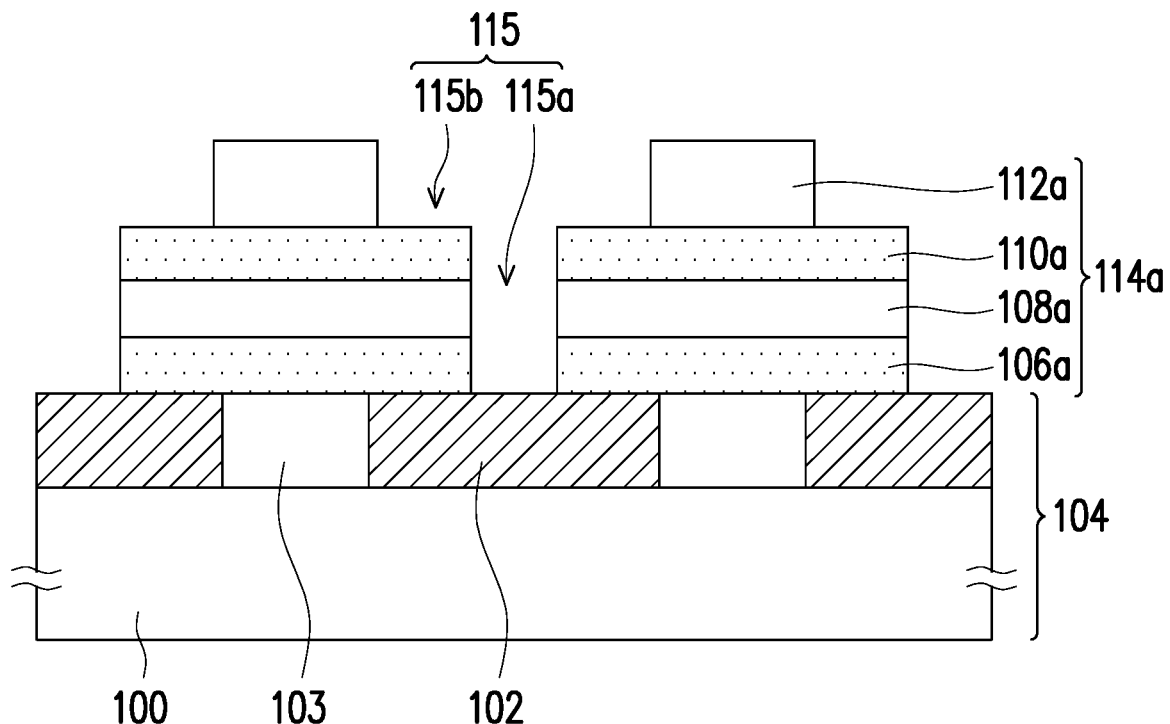

Referring to FIG. 2D, the multi-layer structure 114 is etched by using the first and second photoresist patterns 116a and 118b as an etching mask. The etching operation includes a wet etching, a dry etching or both. In some embodiments, the etching operation is performed in the same etching chamber or in the same etching stage, and such etching operation can be regarded as a single etching operation.

In some embodiments, the multi-layer structure 104 is patterned by using the photoresist stacks 117 as an etching mask, so as to form multi-layer stacks 114a. In some embodiments, the operation of etching the multi-layer structure 114 includes transferring the pattern of the second photoresist pattern 118b to the second insulating layer 112 to form a second insulating pattern 112a, and transferring the pattern of the first photoresist pattern 116a to the first insulating layer 108 to form a first insulating pattern 108a. In some embodiments, the pattern of the first photoresist pattern 116a is simultaneously transferred to the first and second etch stop layers 106 and 110 during the same etching operation, so as to form first and second etch stop patterns 106a and 110a.

In some embodiments, two multi-layer stacks 114a are arranged side by side on the substrate 104, and an opening pattern 115 is formed between the multi-layer stacks 114a. In some embodiments, a damascene structure or a redistribution layer structure is formed in the opening pattern 115. In some embodiments, each of the opening patterns 115 includes a via opening 115a between adjacent first insulating pattern 108a and a trench opening 115b between adjacent second insulating patterns 112a. In some embodiments, the via opening 115a is also formed between adjacent first etch stop patterns 106a and between adjacent second etch stop patterns 110a. In some embodiments, each of the via opening 115a and the trench opening 115b has a substantially vertical sidewall. In alternative embodiments, at least one of the via opening 115a and the trench opening 115b has an inclined sidewall. In some embodiments, the photoresist stacks 117 are then removed by wet stripping or plasma ashing.

Figure 2E:
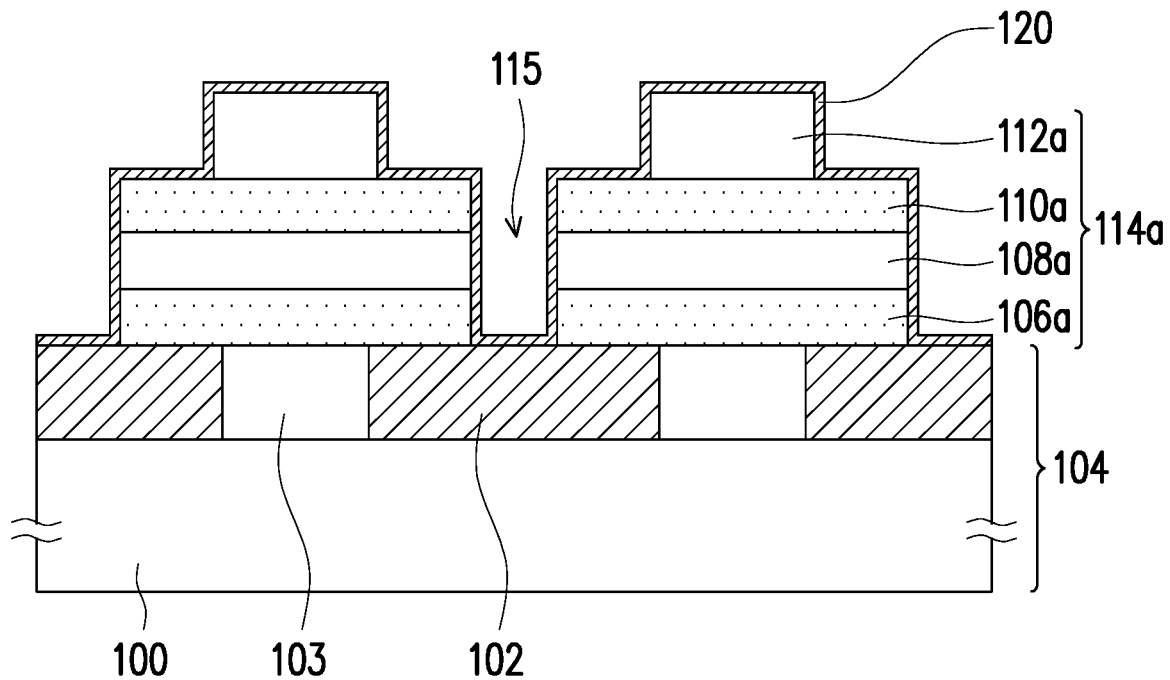

Referring to FIG. 2E, a seed layer 120 is formed over the multi-layer stacks 114a. In some embodiments, the seed layer 120 is formed on the top and sidewall surfaces of the multi-layer stacks 114a and on the bottom surfaces of the opening patterns 115. In some embodiments, the seed layer 120 is in physical contact with the underlying metal features 102 of the substrate 104. In some embodiments, the seed layer 120 includes a metal-containing seed layer such as a copper seed layer. The seed layer 120 is formed to serve as a seed for the plating of a subsequent metal layer 122 (shown in FIG. 2F) over the seed layer 120. The seed layer 120 may be formed by a suitable technique, such as CVD, physical vapor deposition (PVD), atomic layer deposition (ALD), electroplating, chemical electroless plating or a suitable method.

Figure 2F:
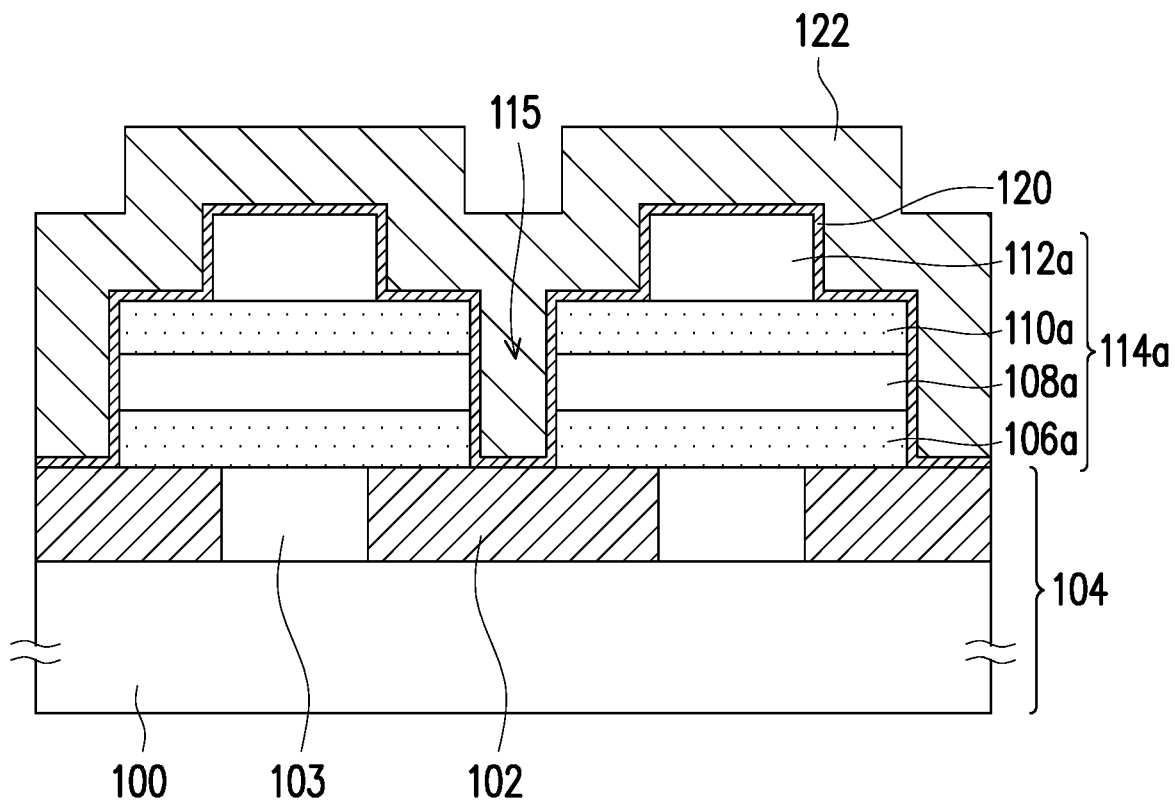

Referring to FIG. 2F, a metal layer 122 is formed over the seed layer 120 and fills up the opening patterns 115 between the multi-layer stacks 114a. In some embodiment, the metal layer 122 includes a metal-containing layer such as a copper layer, a copper alloy layer, an aluminum layer, an aluminum alloy layer, an aluminum copper layer, an aluminum silicon copper layer or a combination thereof. The metal layer 122 may be may be formed by a suitable technique, such as CVD, PVD, ALD, electroplating, chemical electroless plating or a suitable method. In some embodiments, the formation of the seed layer 120 may be omitted if the formation of the metal layer 122 within the opening patterns 115 can be desirably achieved without a seed layer.

Figure 2G:
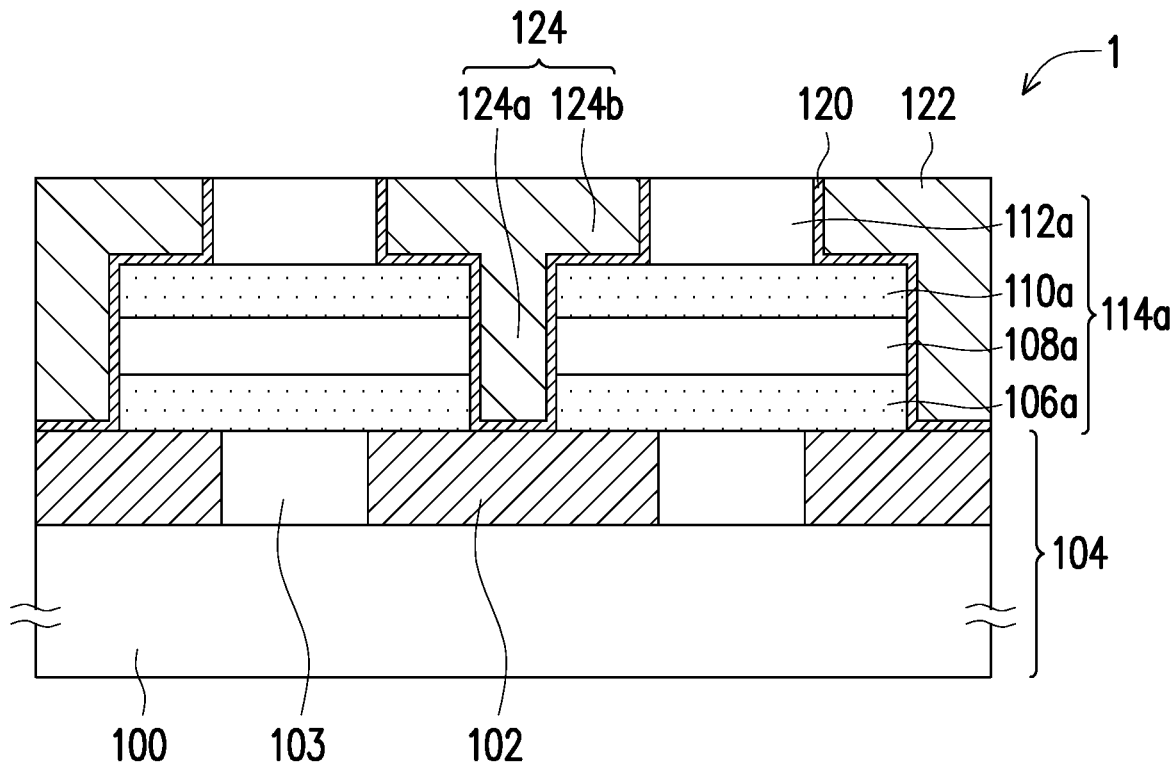

Referring to FIG. 2G, a planarization process such as a chemical mechanical polishing (CMP) process is applied to remove excessive seed layer 120 and excessive metal layer 122 outside the opening patterns 115, and thus, an integrated circuit feature 124 with a stepped sidewall is formed in each of the opening patterns 115. In some embodiments, the integrated circuit feature 124 includes a via 124a and a metal line 124b over the via 124a. Specifically, the via 124a is formed in the via opening 115a of the opening pattern 115 between adjacent first insulating pattern 108a, and the metal line 124b is formed in the trench opening 115b of the opening pattern 115 between adjacent second insulating patterns 112a. In some embodiments, a via 124a and a metal line 124b constitute a damascene structure. In alternative embodiments, a via 124a and a metal line 124b constitute a redistribution layer structure. A semiconductor structure 1 of the disclosure is thus completed.

Figure 3:
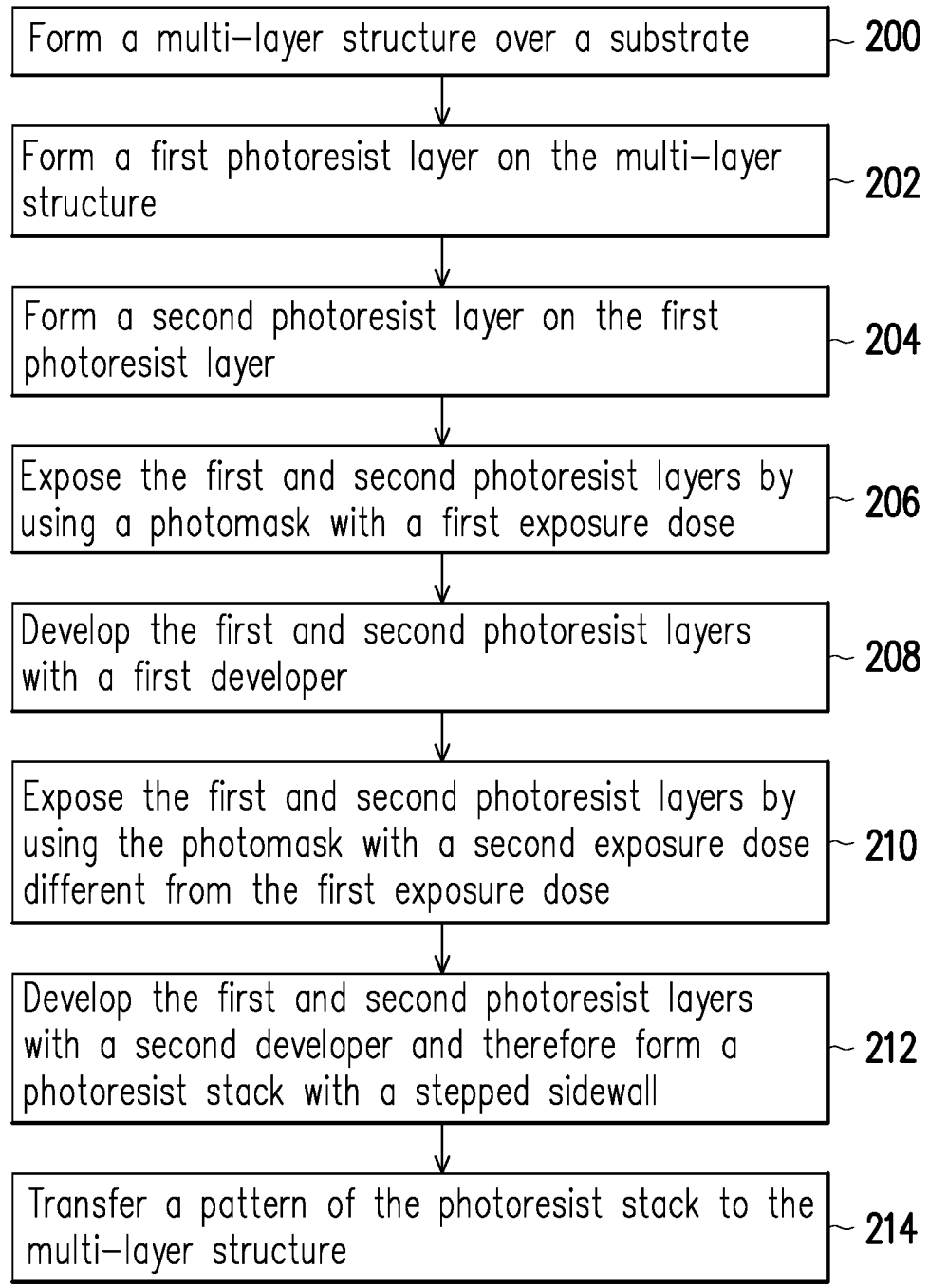
FIG. 3 is a flow chart of a method of forming a semiconductor structure in accordance with some embodiments.

FIG. 3 is a flow chart of a method of forming a semiconductor structure in accordance with some embodiments. In some embodiments, the process operations of FIG. 2A to FIG. 2G can be concisely illustrated with reference to the flow chart of FIG. 3.

At operation 200, a multi-layer structure 114 is formed over a substrate 104. At operation 202, a first photoresist layer 116 is formed on the multi-layer structure 114. At operation 204, a second photoresist layer 118 is formed on the first photoresist layer 116. In some embodiments, the second photoresist layer 118 is formed directly on or in physical contact with the first photoresist layer 116. In some embodiments, the first photoresist layer 116 includes a first photoresist material, the second photoresist layer 118 comprising a second photoresist material different from the first photoresist material. In some embodiments, the first photoresist material has a first exposure threshold, the second photoresist material has a second exposure threshold, and the first exposure threshold is higher than the second exposure threshold. At operation 206, the first and second photoresist layers 116 and 118 are exposed by using a photomask 10 with a first exposure dose. At operation 208, the first and second photoresist layers 116 and 118 are developed with a first developer after the first exposing operation 208. At operation 210, the first and second photoresist layers 116 and 118 are exposed by using the photomask 10 with a second exposure dose different from the first exposure dose. In some embodiments, the second exposure dose is higher than the first exposure dose. At operation 212, the first and second photoresist layers 116 and 118 are developed with a second developer after the second exposing operation 210, and therefore, a photoresist stack 117 with a stepped sidewall is formed on the multi-layer structure 114. In some embodiments, the first developer is the same as the second developer. At operation 214, the pattern of the photoresist stack 117 is transferred to the multi-layer structure 114, and therefore, an opening pattern 115 with a stepped sidewall is formed through multi-layer structure 114. In some embodiments, an integrated circuit feature 124 is formed in the opening pattern 115. In some embodiments, the integrated circuit feature 124 is a damascene structure or a redistribution layer structure.

The above embodiments in which a two-exposure-two-development process with a single photomask is performed to define a damascene structure or a redistribution layer structure are provided for illustration purposes, and are not construed as limiting the present disclosure. It is appreciated by people having ordinary skilled in the art that a multiple-exposure-multiple-development process with a single photomask can be performed upon the process requirements. Specifically, multiple exposure (or exposing) processes and multiple development (or developing) processes are performed alternately to multiple photoresist layers with a single photomask, and the finished photoresist stack is a composite of the photoresist patterns from the multiple-exposure-multiple-development process.

Figure 4:
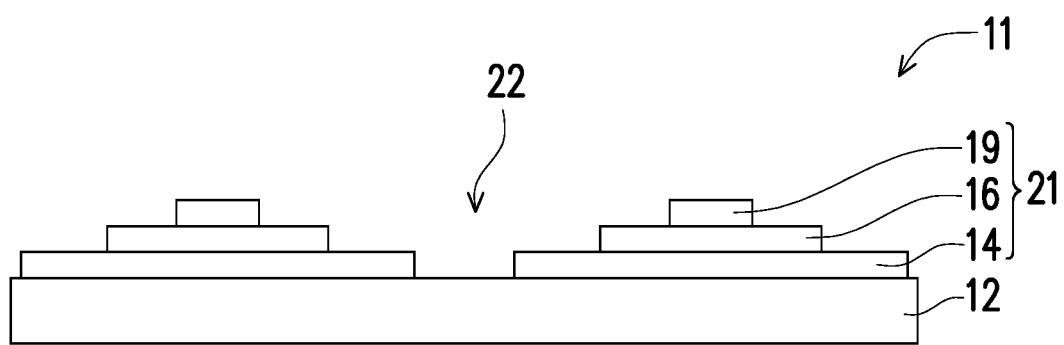
FIG. 4 is a cross-sectional view of a photomask in accordance with alternative embodiments.

FIG. 4 is a cross-sectional view of a photomask in accordance with alternative embodiments. In some embodiments, a photomask is used to pattern three photoresist layers by a three-exposure-three-development process.

In some embodiments, a photomask 11 includes a mask substrate 12, a first mask pattern 14, a second mask pattern 16 and a third mask pattern 19. In some embodiments, the mask substrate 12 has a reference transmittance T0. The first mask pattern 14 is over the mask substrate and has a first transmittance T1. The second mask pattern 16 is over the first mask pattern 14 and has a second transmittance T2 less than the first transmittance T1. The third mask pattern 19 is over the second mask pattern 16 and has a third transmittance T3 less than the second transmittance T2.

In some embodiments, the reference transmittance T0 is assigned to be 100% and first to third transmittances T1 to T3 are defined relative to the reference transmittance T0. In some embodiments, the third transmittance T3 is less than 10% of the reference transmittance T0, the second transmittance T2 is between about 15% and 50% of the reference transmittance T0, and the first transmittance T1 is between about 55% and 90% of the reference transmittance T0. It is appreciated by people having ordinary skill in the art that, the transmittance range for each of the first to third mask patterns is provided for illustration purposes, and is not construed as limiting the present disclosure. Other transmittance ranges are possible and may be desirable in certain applications.

In some embodiments, the boundary of the third mask pattern 19 is within the boundary of the second mask pattern 16, and the boundary of the second mask pattern 16 is within the boundary of the first mask pattern 14. In some embodiments, the first mask pattern 14, the second mask pattern 16 and the third mask pattern 19 constitute a mask stack 21 having stepped sidewalls at both sides. However, the present disclosure is not limited thereto. In alternative embodiments, the first mask pattern 14, the second mask pattern 16 and the third mask pattern 19 are aligned at one side, while constitute a stepped sidewall at the opposite side.

In some embodiments, two mask stacks 21 are arranged side by side on the mask substrate 12, and an opening pattern 22 having a stepped sidewall is formed between the mask stacks 21.

In some embodiments, the method to pattern three photoresist layers by using the mask 11 and the semiconductor structure made thereby are further described below according to one embodiment with reference to FIG. 5 and FIG. 6A to FIG. 6D.

Figure 5:
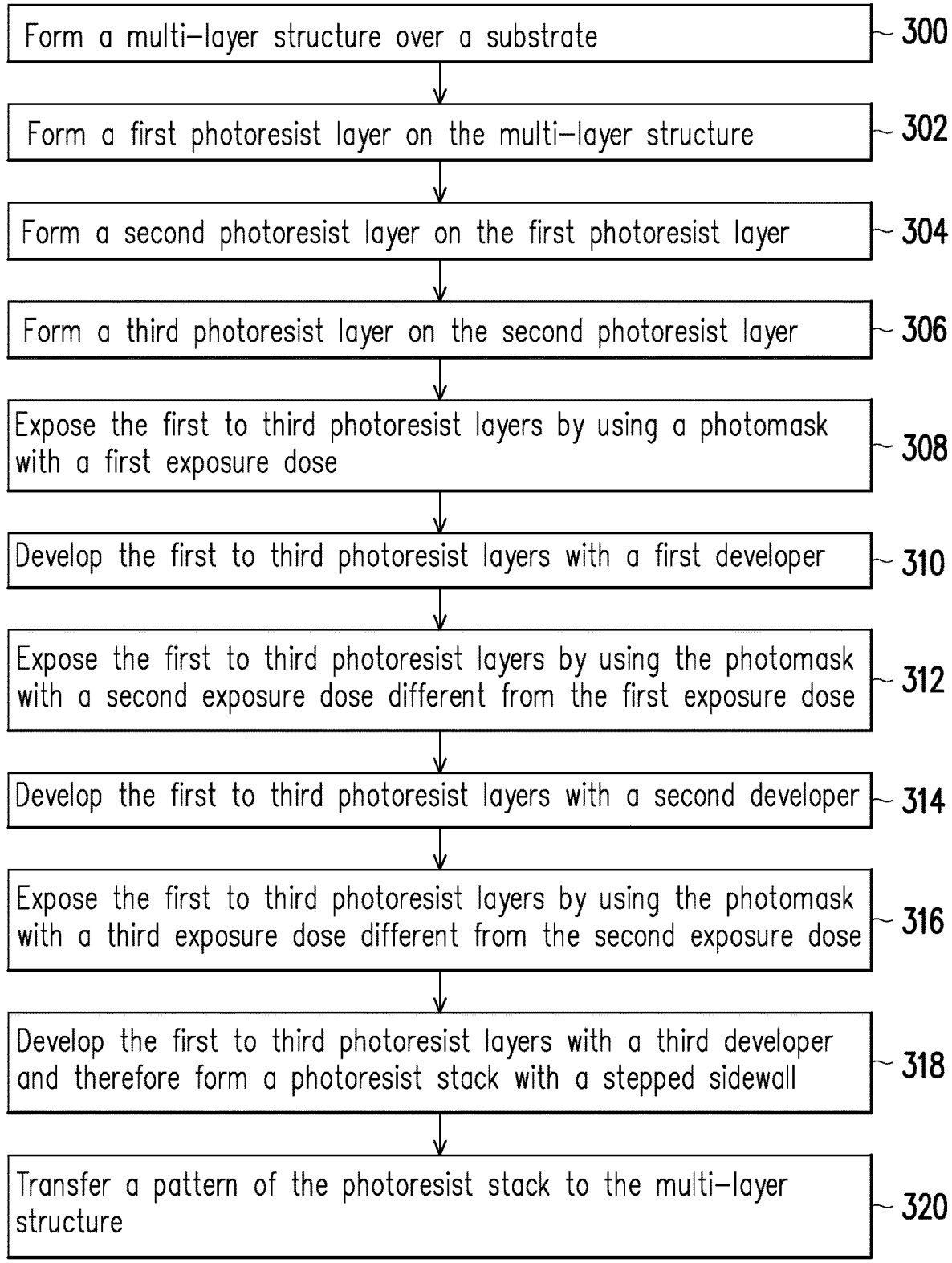
FIG. 5 is a flow chart of a method of forming a semiconductor structure in accordance with alternative embodiments.
Figure 6A:
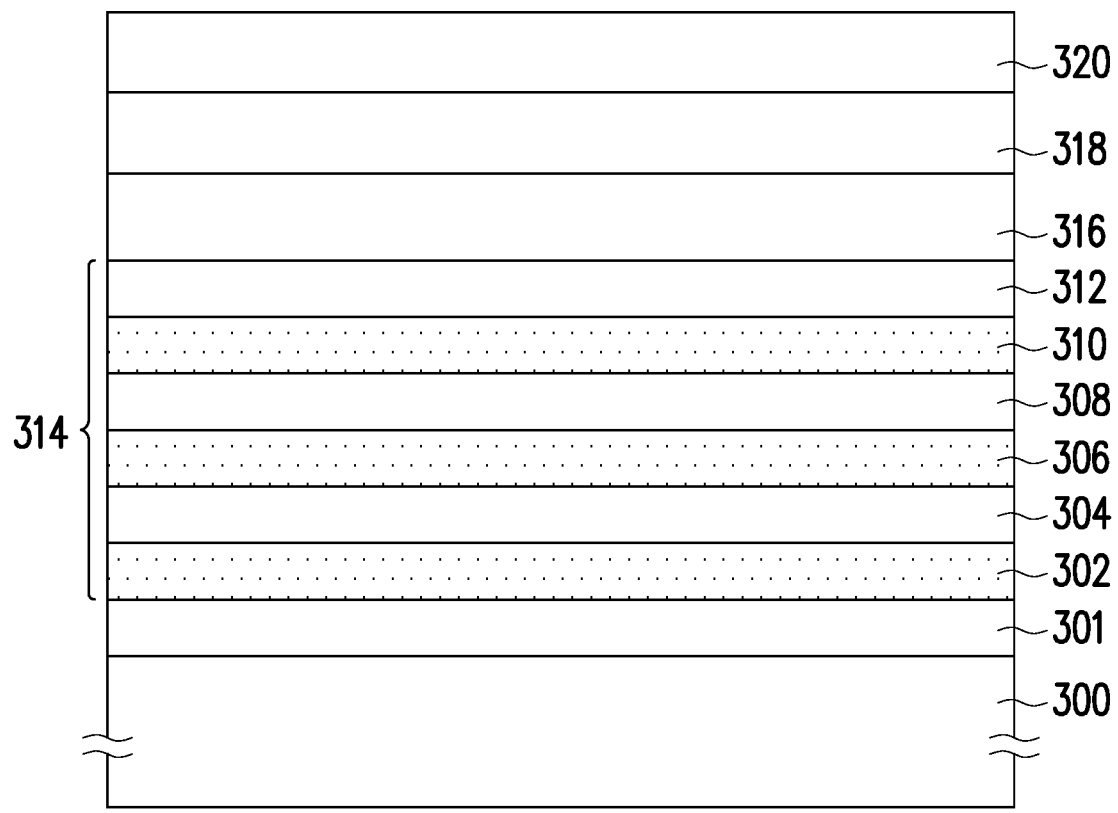
FIG. 6A to FIG. 6D are schematic cross-sectional views of a method of forming a semiconductor structure in accordance with alternative embodiments.
Figure 6B:
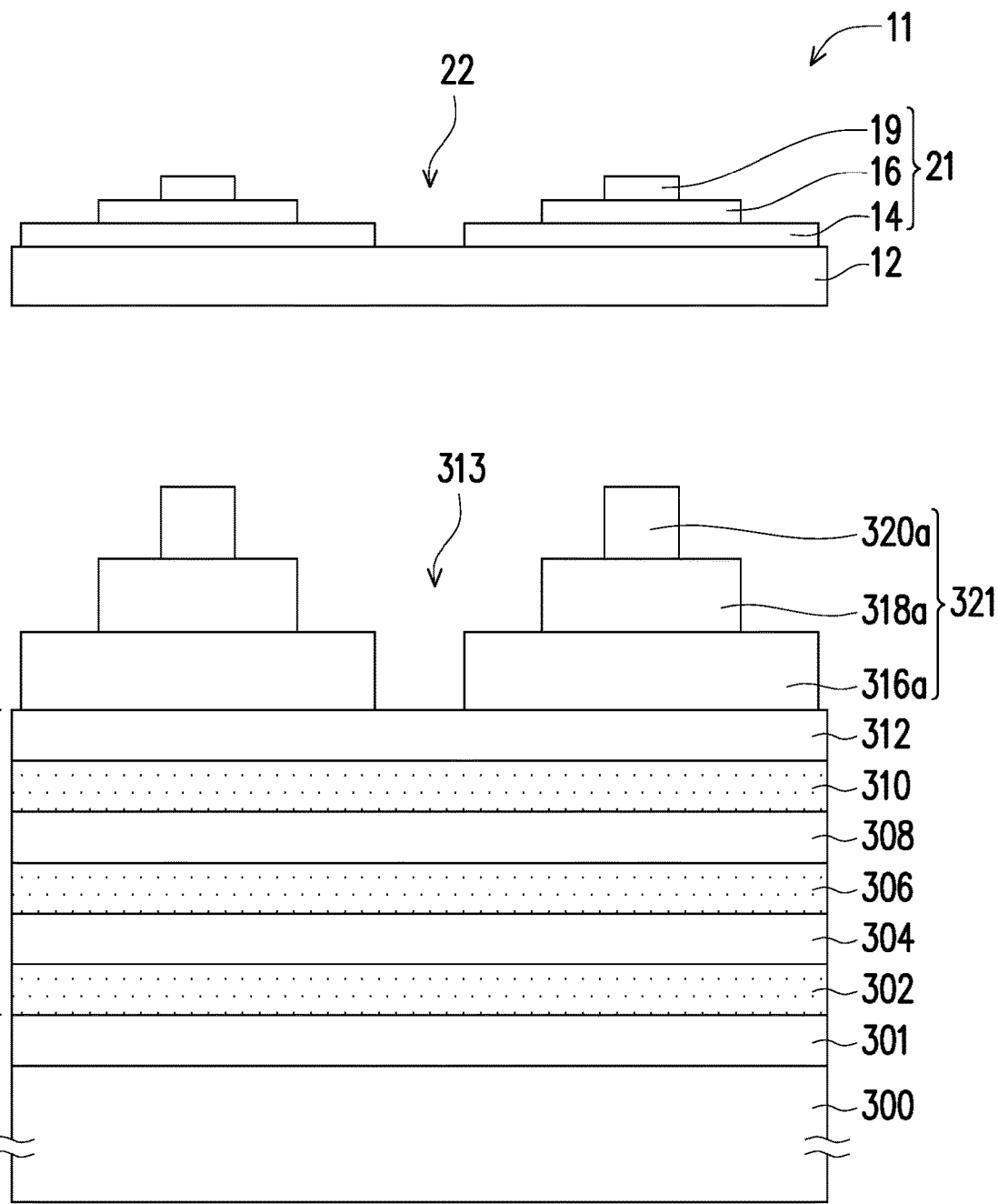
Figure 6C:
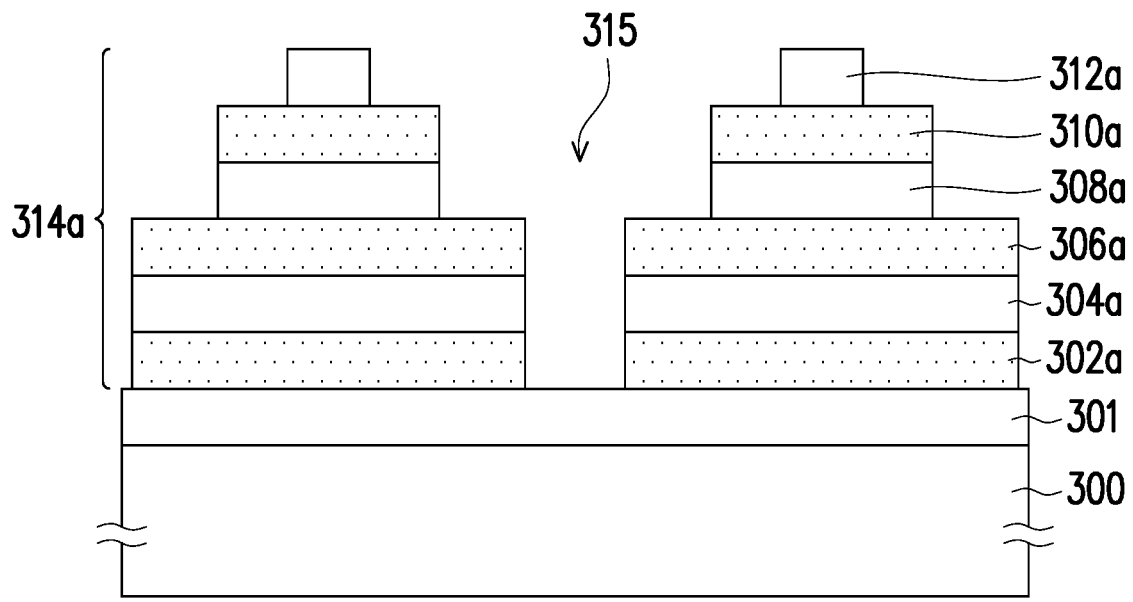
Figure 6D:
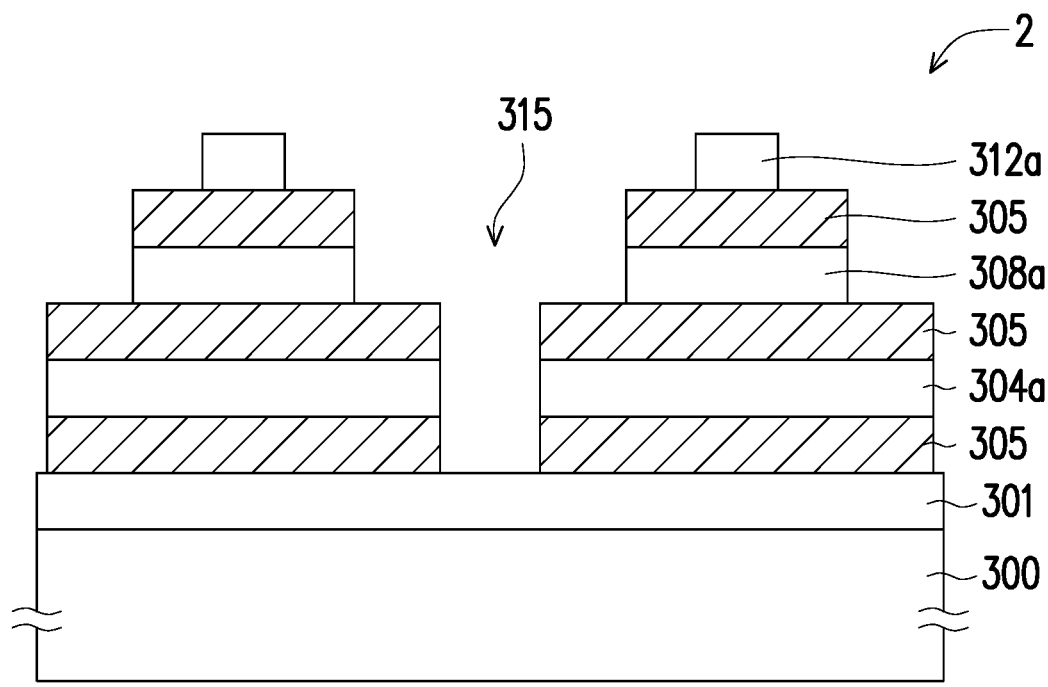

FIG. 5 is a flow chart of a method of forming a semiconductor structure in accordance with alternative embodiments. FIG. 6A to FIG. 6D are schematic cross-sectional views of a method of forming a semiconductor structure in accordance with alternative embodiments.

At operation 300, a multi-layer structure 314 is formed over a substrate 300. In some embodiments, an isolation layer 301 is optionally formed between the multi-layer structure 314 and the substrate 300. In some embodiments, the multi-layer structure 314 includes, from bottom to top, a first etch stop layer 302, a first insulating layer 304, a second etch stop layer 306, a second insulating layer 308, a third etch stop layer 310, and a third insulating layer 312. The etch stop layer has an etch selectivity to the overlying insulating layer. The numbers of the insulating layers and etch stop layers are not limited by the figures of the disclosure. In some embodiments, the etch stop layers are referred to as sacrificial layers, and conductive layers are formed to replace the sacrificial layers for further application.

At operation 302, a first photoresist layer 316 is formed on the multi-layer structure 314. At operation 304, a second photoresist layer 318 is formed on the first photoresist layer 316. At operation 306, a third photoresist layer 320 is formed on the second photoresist layer 318. In some embodiments, the second photoresist layer 318 is between and in physical contact with the first photoresist layer 316 and the third photoresist layer 320. In some embodiments, the first, second and third photoresist layers 316, 318 and 320 are chosen to have different exposure thresholds or threshold exposure doses. In some embodiments, the exposure threshold of the first photoresist layer 316 is higher than that the exposure threshold the second photoresist layer 318, and the exposure threshold the second photoresist layer 318 is higher than that the exposure threshold the third photoresist layer 320.

At operation 308, first to third photoresist layers 316 to 320 are exposed by using a photomask 11 with a first exposure dose. At operation 310, the first to third photoresist layers 316 to 320 are developed with a first developer. At operation 312, the first to third photoresist layers 316 to 320 are exposed by using the photomask 11 with a second exposure dose different from the first exposure dose. At operation 314, the first to third photoresist layers 316 to 320 are developed with a second developer. At operation 316, the first to third photoresist layers 316 to 320 are exposed by using the photomask 11 with a third exposure dose different from the second exposure dose. At operation 318, the first to third photoresist layers 316 to 320 are developed with a third developer and therefore form a photoresist stack 321 with a stepped sidewall.

In some embodiments, the photoresist stack 321 includes, from bottom to top, a first photoresist pattern 316a, a second photoresist pattern 318a and a third photoresist pattern 320a. In some embodiments, the width of the third photoresist pattern 320a is smaller than the width of the second photoresist pattern 318a, and the width of the second photoresist pattern 318a is smaller than the width of the first photoresist pattern 316a. In some embodiments, the boundary of the third photoresist pattern 320a is within the boundary of the second photoresist pattern 318a, and the boundary of the second photoresist pattern 318a is within the boundary of the first photoresist pattern 316a. In some embodiments, two photoresist stacks 321 are arranged side by side on the multi-layer structure 314, and an opening pattern 313 is formed between the photoresist stacks 321. In some embodiments, the opening pattern 313 defines a stepped contact pad structure.

In some embodiments, the first exposure dose of the first exposing operation 308 is less than that the second exposure dose of the second exposing operation 312, and the second exposure dose of the second exposing operation 312 is less than that the third exposure dose of the third exposing operation 316.

In some embodiments, the first developer, the second developer and the third developer have the same composition, and the first developing operation 310, the second developing operation 314 and the third developing operation 318 can be performed in the same developer unit. However, the present disclosure is not limited thereto. In alternative embodiments, the first developer, the second developer and the third developer are different in composition, and the first developing operation 310, the second developing operation 314 and the third developing operation 318 can be performed in different developer units.

At operation 320, the pattern of the photoresist stack 321 is transferred to the multi-layer structure 314, and therefore, an opening pattern 315 with a stepped sidewall is formed through multi-layer structure 314. In some embodiments, the multi-layer structure 314 is patterned by using the photoresist stacks 321 as an etching mask, so as to form multi-layer stacks 114a. In some embodiments, each of the multi-layer stacks 114a includes, from bottom to top, a first etch stop pattern 302a, a first insulating pattern 304a, a second etch stop pattern 306a, a second insulating pattern 308a, a third etch stop pattern 310a and a third insulating pattern 312a.

In some embodiments, conductive layers 305 are formed to replace the first to third etch stop layers 302a, 306a and 310a of the multi-layer stacks 314a. A semiconductor structure 2 has a stepped contact pad structure is thus completed. In some embodiments, the exposed conductive layers 305 serve as landing zones of contact pads, and contacts are subsequently formed to land on the landing zones of the contact pads.

Figure 7A:
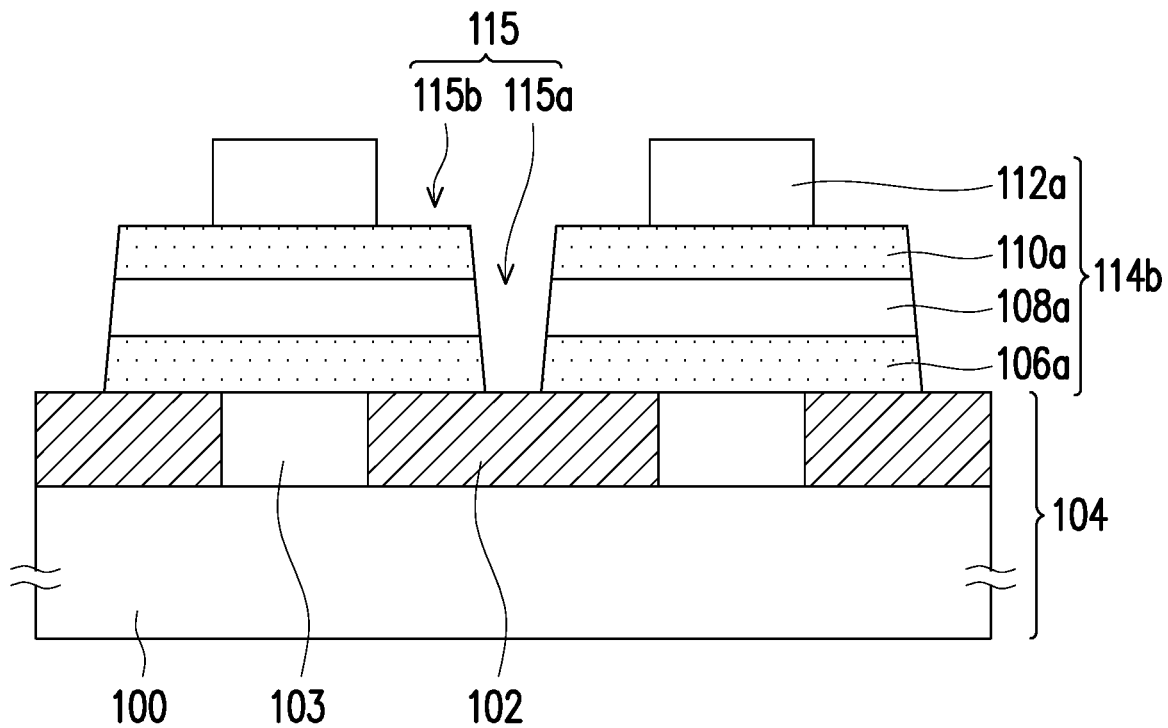
FIG. 7A to FIG. 7B are schematic cross-sectional views of a method of forming a semiconductor structure in accordance with alternative embodiments.
Figure 7B:
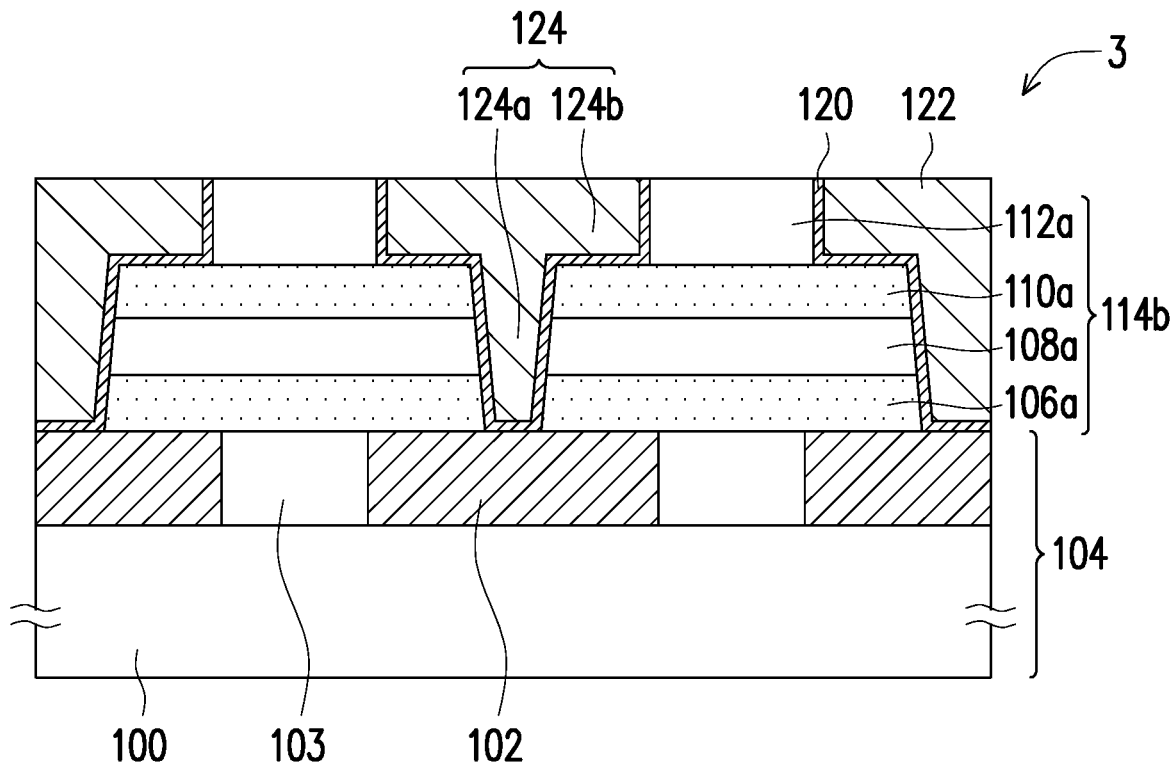

In the embodiments of FIG. 2A to FIG. 2D, a photoresist stack 117 with a stepped sidewall is formed on the multi-layer structure 114 upon the process operations of FIG. 2A to FIG. 2C, and the pattern of the photoresist stack 117 is transferred to the multi-layer structure 114 to form multi-layer stacks 114a upon the process operation of FIG. 2D. In the embodiments of FIG. 2A to FIG. 2D, each of the multi-layer stacks 114a is formed with substantially vertical sidewalls. However, the present disclosure is not limited thereto. In alternative embodiments, after the process operations of FIG. 2A to FIG. 2C are performed, the pattern of the photoresist stack 117 is transferred to the multi-layer structure 114 to form multi-layer stacks 114b having inclined sidewalls, as shown in FIG. 7A. Specifically, two multi-layer stacks 114b are arranged side by side on the substrate 104, and an opening pattern 115 is formed between the multi-layer stacks 114b. In the embodiment of FIG. 7A, each of the opening patterns 115 includes a via opening 115a with an inclined sidewall and a trench opening 115b with a substantially vertical sidewall. Thereafter, process operations similar to those described in FIG. 2E to FIG. 2G are performed, so as to form a semiconductor structure 3 having integrated circuit features 124 therein, as shown in FIG. 7B.

In view of the above, in some embodiments, an integrated circuit feature having a stepped profile can be easily defined by a single photomask and a single etching process. The process flow is simple and suitable for mass production. Besides, the overly between adjacent features (e.g., metal to via) can be improved. With the disclosed method, both the manufacturing cost and manufacturing cycle time can be reduced. In addition, with the method of the disclosure, the integrated circuit features may be formed with desired profiles, e.g., having substantially vertical sidewalls, inclined sidewalls or a combination thereof. Accordingly, the product and process flexibility are both improved.

In accordance with some embodiments of the present disclosure, a method of forming a semiconductor structure includes following operations. A multi-layer structure is formed over a substrate. A photoresist stack with a stepped sidewall is formed on the multi-layer structure. A pattern of the photoresist stack is transferred to the multi-layer structure.

In accordance with alternative embodiments of the present disclosure, a method of forming a semiconductor structure includes following operations. A multi-layer structure is formed over a substrate. A first photoresist layer is formed on the multi-layer structure. A second photoresist layer is formed on the first photoresist layer. The first and second photoresist layers are exposed by using a photomask with a first exposure dose. The first and second photoresist layers are developed with a first developer. The first and second photoresist layers are exposed by using the photomask with a second exposure dose different from the first exposure dose. The first and second photoresist layers are developed with a second developer.

In accordance with yet alternative embodiments of the present disclosure, a method of forming a semiconductor structure includes following operations. A photomask is provided, and the photomask includes a mask substrate, a first mask pattern over the mask substrate and having a first transmittance, and a second mask pattern over the first mask pattern and having a second transmittance different from the first transmittance. In some embodiments, a width of the second mask pattern is smaller than a width of the first mask pattern. A substrate is provided with a multi-layer structure, a first photoresist layer and a second photoresist layer sequentially formed thereon. A first photolithography process is performed by using the photomask, so as to transfer a pattern of the first mask pattern to the second photoresist layer to form a temporary photoresist pattern. A second photolithography process is performed by using the photomask, so as to transfer the pattern of the first mask pattern to the first photoresist layer to form a first photoresist pattern, and transfer a pattern of the second mask pattern to the temporary photoresist pattern to form a second photoresist pattern. The multi-layer structure is etched by using the first and second photoresist patterns as an etching mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a multi-layer structure comprising etching stop layers and insulating layers alternated stacked on an isolation layer over a substrate;
    forming a photoresist stack on the multi-layer structure;
    wherein forming the photoresist stack comprises forming steps in a sequential order of:
        forming a first photoresist material on the multi-layer structure;
        forming a second photoresist material on the first photoresist material;
        performing a first exposing step to the first and second photoresist materials;
        performing a first developing step to the first and second photoresist materials, so as to remove a portion of the second photoresist material;
        performing a second exposing step to the first and second photoresist materials; and
        performing a second developing step to the first and second photoresist materials, so as to simultaneously remove another portion of the second photoresist material and a portion of the first photoresist material and therefore form the photoresist stack with a stepped sidewall;
        performing a single etching operation to pattern the multi-layer structure by using the photoresist stack with the stepped sidewall as a mask, such that a shape of the patterned multi-layer structure is the same as a shape of the photoresist stack with the stepped sidewall, and a portion of the isolation layer is exposed by the patterned multi-layer structure,
    wherein the isolation layer is in contact with a lowermost etching stop layer, and a sidewall of the lowermost etching stop layer, a sidewall of a lowermost insulating layer and a sidewall of an etching stop layer overlying the lowermost etching stop layer are flushed with each other, and a sidewall of an insulating layer overlying the lowermost insulating layer is recessed from the sidewall of the etching stop layer overlying the lowermost etching stop layer, and
    wherein the method further comprises:
        before performing the first exposing step and after forming the second photoresist material, forming a third photoresist material on the second photoresist material; and
        before performing the single etching operation and after performing the second developing step, performing a third exposing step to the first to third photoresist materials and performing a third developing step to the first to third photoresist materials,
    wherein no etching step is present between the first exposure step and the third developing step.

2. The method of claim 1, wherein the second photoresist material is in contact with the first photoresist material and the third photoresist material.

3. The method of claim 1, wherein the first photoresist material is different from the second photoresist material.

4. The method of claim 1, wherein the isolation layer remains substantially unchanged after the single etching operation.

5. The method of claim 1, wherein the first photoresist material has a first exposure threshold, the second photoresist material has a second exposure threshold, and the first exposure threshold is higher than the second exposure threshold.

6. The method of claim 1, wherein the photoresist stack with the stepped sidewall is defined by a single photomask.

7. The method of claim 6, wherein the photomask comprises:
    a mask substrate having a reference transmittance;
    a first mask pattern over the mask substrate and having a first transmittance; and
    a second mask pattern over the first mask pattern and having a second transmittance less than the first transmittance.

8. The method of claim 7, wherein the second transmittance is less than about 10% of the reference transmittance, and the first transmittance is between about 15% and about 90% of the reference transmittance.

9. The method of claim 7, wherein the photomask further comprises a third mask pattern over the second mask pattern and having a third transmittance less than the second transmittance.

10. The method of claim 9, wherein the third transmittance is less than about 10% of the reference transmittance, the second transmittance is between about 15% and about 50% of the reference transmittance, and the first transmittance is between about 55% and about 90% of the reference transmittance.

11. The method of claim 1, wherein the first developing step, the second developing step and the third developing step are performed in the same developer unit.

12. A method of forming a semiconductor structure, comprising forming steps in a sequential order of:
    forming a first photoresist layer on a substrate;
    forming a second photoresist layer on the first photoresist layer;
    forming a third photoresist layer on the second photoresist layer;
    exposing the first to third photoresist layers to a first light by using a photomask with a first exposure dose;
    developing the first to third photoresist layers with a first developer;
    exposing the first to third photoresist layers to a second light by using the photomask with a second exposure dose different from the first exposure dose; and
    developing the first to third photoresist layers with a second developer;
    exposing the first to third photoresist layers to a third light by using the photomask with a third exposure dose different from the second exposure dose;
    developing the first to third photoresist layers with a third developer, and therefore forming a photoresist stack with a stepped sidewall; and
    performing a single etching operation to pattern the substrate by using the photoresist stack with the stepped sidewall as a mask, such that a shape of the patterned substrate is the same as a shape of the photoresist stack with the stepped sidewall.

13. The method of claim 12, wherein the first developer, the second developer and the third developer have the same composition.

14. The method of claim 13, wherein the third exposure dose is higher than the second exposure dose, and the second exposure dose is higher than the first exposure dose.

15. The method of claim 12, wherein the substrate comprises etching stop layers and insulating layers alternated stacked on an isolation layer, and
    wherein after the single etching operation, the isolation layer is in contact with a lowermost etching stop layer, and a sidewall of the lowermost etching stop layer, a sidewall of a lowermost insulating layer and a sidewall of an etching stop layer overlying the lowermost etching stop layer are flushed with each other, and a sidewall of an insulating layer overlying the lowermost insulating layer is recessed from the sidewall of the etching stop layer overlying the lowermost etching stop layer.

16. A method of forming a semiconductor structure, comprising:
providing a photomask, wherein the photomask comprises:
a mask substrate;
a first mask over the mask substrate and having a first transmittance;
a second mask over the first mask and having a second transmittance different from the first transmittance; and
a third mask layer over the second mask layer and having a third transmittance different from the second transmittance, wherein the first to third mask layers constitute a mask stack having a stepped sidewall;
providing a substrate having a multi-layer structure, a first photoresist layer, a second photoresist layer and a third photoresist layer sequentially formed thereon;
after providing the substrate, sequentially performing a first exposure process by using the photomask and a first developing process to the first to third photoresist layers;
after performing the first developing process, sequentially performing a second exposure process by using the photomask and a second developing process to the first to third photoresist layers;
after performing the second developing process, sequentially performing a third exposure process by using the photomask and a third developing process to the first to third photoresist layers, and therefore forming a photoresist stack with a stepped sidewall; and
performing a single etching operation to pattern the multi-layer structure by using the photoresist stack with the stepped sidewall as a mask, such that a shape of the patterned multi-layer structure is the same as a shape of the photoresist stack with the stepped sidewall.

17. The method of claim 16, wherein the multi-layer structure comprises first layers and second layers alternated stacked on the substrate.

18. The method of claim 16, wherein the second transmittance is less than the first transmittance, and the third transmittance is less than the second transmittance.

19. The method of claim 16, wherein no etching step is present between the first exposure process and the third developing process.

20. The method of claim 16, wherein the multi-layer structure comprises etching stop layers and insulating layers alternated stacked on an isolation layer, and
wherein after the single etching operation, the isolation layer is in contact with a lowermost etching stop layer, and a sidewall of the lowermost etching stop layer, a sidewall of a lowermost insulating layer and a sidewall of an etching stop layer overlying the lowermost etching stop layer are flushed with each other, and a sidewall of an insulating layer overlying the lowermost insulating layer is recessed from the sidewall of the etching stop layer overlying the lowermost etching stop layer.

* * * * *